(12) United States Patent
Paci

(10) Patent No.: US 10,288,697 B2
(45) Date of Patent: May 14, 2019

(54) AMR-TYPE INTEGRATED MAGNETORESISTIVE SENSOR FOR DETECTING MAGNETIC FIELDS PERPENDICULAR TO THE CHIP

(71) Applicant: STMicroelectronics S.R.L., Agrate Brianza (IT)

(72) Inventor: Dario Paci, Sedriano (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 354 days.

(21) Appl. No.: 14/947,835

(22) Filed: Nov. 20, 2015

(65) Prior Publication Data
US 2016/0202329 A1    Jul. 14, 2016

(30) Foreign Application Priority Data
Jan. 13, 2015    (IT) .............................. TO2015A0028

(51) Int. Cl.
| G01R 33/00 | (2006.01) |
|---|---|
| G01R 33/02 | (2006.01) |
| G01R 33/09 | (2006.01) |
| H01L 43/02 | (2006.01) |
| H01L 43/12 | (2006.01) |
| H01L 43/08 | (2006.01) |

(52) U.S. Cl.
CPC ...... *G01R 33/0011* (2013.01); *G01R 33/0052* (2013.01); *G01R 33/093* (2013.01); *G01R 33/096* (2013.01); *H01L 43/08* (2013.01); *H01L 43/12* (2013.01)

(58) Field of Classification Search
CPC .... G01R 33/00; G01R 33/0011; G01R 33/02; G01R 33/096; G01R 33/09; H01L 43/02; H01L 43/12
See application file for complete search history.

(56) References Cited

U.S. PATENT DOCUMENTS

| 5,247,278 A * | 9/1993 | Pant ..................... G01R 33/096 324/252 |
|---|---|---|
| 7,095,226 B2 | 8/2006 | Wan et al. |
| 7,271,586 B2 | 9/2007 | Bohlinger et al. |
| 2003/0042900 A1 * | 3/2003 | Witcraft ................. G01R 33/09 324/252 |
| 2009/0027048 A1 | 1/2009 | Sato et al. |
| 2012/0161759 A1 * | 6/2012 | Pozzati .................. B82Y 25/00 324/252 |

(Continued)

OTHER PUBLICATIONS

Tumanski, S., "Thin Film Magnetoresistive Sensors," IOP Publishing Ltd, 2001, 172 pgs.

*Primary Examiner* — Neel D Shah
(74) *Attorney, Agent, or Firm* — Seed IP Law Group LLP

(57) ABSTRACT

An AMR-type integrated magnetoresistive sensor sensitive to perpendicular magnetic fields is formed on a body of semiconductor material covered by an insulating region. The insulating region houses a set/reset coil and a magnetoresistor arranged on the set/reset coil. The magnetoresistor is formed by a magnetoresistive strip of an elongated shape parallel to the preferential magnetization direction. A concentrator of ferromagnetic material is arranged on top of the insulating region as the last element of the sensor and is formed by a plurality of distinct ferromagnetic regions aligned parallel to the preferential magnetization direction.

25 Claims, 9 Drawing Sheets

(56) References Cited

U.S. PATENT DOCUMENTS

2013/0299930 A1* 11/2013 Paci ................. B82Y 25/00
                                                      257/422
2014/0111194 A1    4/2014 Liou et al.
2014/0159717 A1    6/2014 Paci et al.
2014/0353785 A1* 12/2014 Paci ................. G01R 33/096
                                                      257/427

* cited by examiner

AMR-TYPE INTEGRATED MAGNETORESISTIVE SENSOR FOR DETECTING MAGNETIC FIELDS PERPENDICULAR TO THE CHIP

BACKGROUND

Technical Field

The present disclosure relates to an integrated magnetoresistive sensor of an AMR (anisotropic magnetoresistance) type for detecting magnetic fields perpendicular to the chip integrating the magnetoresistive sensor. In particular, the magnetoresistive sensor may be integrated with other magnetoresistors sensitive to magnetic fields parallel to the chip for forming a triaxial magnetometer integrated in a single chip.

Description of the Related Art

AMR-type magnetic-field sensors are used in a plurality of applications and systems, for example in compasses, in ferromagnetic characteristics detecting systems, in detection of currents, and in a wide range of other applications, by virtue of their capacity of detecting natural magnetic fields (for example, the Earth's magnetic field) and magnetic fields generated by electrical components (such as electrical or electronic devices and lines passed by electric currents).

As known, magnetoresistive sensors exploit the capacity of appropriate ferromagnetic materials (referred to as "magnetoresistive materials", for example, the material known by the term "permalloy" formed by a FeNi alloy) of modifying their own resistance in presence of an external magnetic field.

Integrated magnetoresistive sensors are known having the form of strips of magnetoresistive material arranged on a substrate of semiconductor material, for example silicon. During manufacture, the magnetoresistive material strip is magnetized so as to have a preferential magnetization in a preset direction, referred to as "easy axis" since it is the direction of easier magnetization of the strip, typically the longitudinal direction of the strip.

In the absence of external magnetic fields, the magnetization maintains the set direction, and the strip has a maximum resistance. In presence of external magnetic fields that have a direction different from the preferential magnetization direction, the strip magnetization changes, as well as its resistance, which decreases, as shown in FIGS. 1A and 1B.

In FIG. 1A, a magnetoresistor 1 is formed by a magnetoresistive strip 2 having a longitudinal direction parallel to axis X and forming the easy axis. The magnetoresistor 1 is supplied with a current I flowing in the longitudinal direction of the strip. In the shown condition, in the absence of external magnetic fields, the magnetization M is directed parallel to the easy axis EA.

In FIG. 1B, the magnetoresistor 1 is immersed in an external magnetic field Hy directed parallel to axis Y (referred to as also "hard axis", i.e., the axis of more difficult magnetization of the magnetoresistive strip 2). In this condition, the external magnetic field Hy causes a rotation of the magnetization M through an angle $\alpha$ with respect to the current I, causing a reduction of the resistance of the magnetoresistive strip 2 according to a law correlated to $\cos^2 \alpha$.

In order to linearize the plot of the resistance R at least in an operating portion of the curve, it is further known to form, on the magnetoresistive strip 2, transverse strips 3 (referred to as "barber poles"), of conductive material (for example, aluminum), which are arranged with an inclination of 45° with respect to the direction of easy axis EA, as shown in FIG. 2.

In this situation, the direction of the current I changes, but not the magnetization M (the direction whereof still depends upon the external magnetic field), and the resistance has a linear characteristic around the zero point of the external magnetic field. In this way, possible magnetic fields directed along or having a component parallel to axis Y may be detected easily.

FIG. 3 shows a magnetoresistive sensor including four magnetoresistors 1 of the type illustrated in FIG. 2, connected to form a Wheatstone bridge 4. In the illustrated example, the Wheatstone bridge 4 comprises two magnetoresistors 1a having transverse strips 3 directed at +45° and two magnetoresistors 1b having transverse strips 3 directed at −45°. The magnetoresistors 1a, 1b are arranged in an alternating way in each branch 4a and 4b of the bridge. The two branches 4a, 4b are connected at two input nodes 5, 6 and a biasing voltage Vb is applied across them.

In this way, in the absence of external magnetic field components parallel to the sensing direction (here the field Hx), the output voltage Vo across the output terminals 7, 8 is, to a first approximation, zero. Instead, an external magnetic field Hx causes an increase of the resistivity of two magnetoresistors, for example the magnetoresistors 1a, and a corresponding reduction of the resistivity of the other magnetoresistors, for example the magnetoresistors 1b, causing an unbalancing of the Wheatstone bridge 4 and a non-zero output voltage Vo. Consequently, each variation of resistance due to an external field Hx parallel to the plane of the magnetoresistors 1a, 1b and perpendicular to their extension direction causes a corresponding linear variation of the output voltage Vo.

When it is desired to detect magnetic fields that have components directed along any direction parallel to the main faces of the chip integrating the magnetoresistor (plane XY), it is possible to arrange the magnetoresistors 1 perpendicular to each other, as shown in the sensor 10 of FIG. 4 where, for simplicity, a magnetoresistor 1x, for detecting the component X, and a magnetoresistor 1y, for detecting the component Y, are shown. Obviously, each magnetoresistor 1x, 1y of FIG. 4 may be replaced by a respective Wheatstone bridge similar to that of FIG. 3, wherein the four magnetoresistors 1x are directed perpendicular to the four magnetoresistors 1y.

By virtue of the high sensitivity of the magnetoresistive sensors of the type referred to above, they have been proposed for use as electronic compasses in navigation systems. In this case, the external field to be detected is represented by the Earth's magnetic field. To a first approximation, the Earth's magnetic field may be considered parallel to the Earth's surface, and reading of the compass may be made using the sensor 10, where X and Y represent the two directions of the plane locally tangential to the Earth's surface. However, since the inclination of the compass with respect to the tangential plane causes reading errors, in order to correct it, it is practical to have three sensors, each sensitive to a respective axis X, Y, Z.

To this end, some compasses integrate the X and Y sensors in a single chip, and the latter is fixed parallel to a base or frame, and the Z sensor, manufactured in a planar way, like the X and Y sensors, in a suitable chip, is fixed to the frame rotated through 90°, in a vertical position. However, in this case, the assembly is complex, and the end device is costly. Further, the packaged device has an excessive volume (in particular an excessive height), which does not enable use thereof in small apparatus.

In order to solve the above problem, a ferromagnetic concentrator has been proposed, arranged alongside a planar magnetoresistor and directed transversely to the sensitivity plane of the magnetoresistor (see, for example, U.S. Patent Publication No. 2013/0299930 and U.S. Patent Publication No. 2014/0159717). For a better understanding, reference may be made to FIG. 5, showing a magnetoresistive sensor 15 formed according to the teachings of above patent application TO2012A001067 in a chip having a substrate 16 of conductive material, for example silicon, and an insulating layer 17. The substrate 16 has a main face 20, which is planar, and the insulating layer 17 houses a magnetoresistor 18, which extends parallel to the main face 20. The magnetoresistor 15 is formed as shown in FIG. 2 and thus comprises a magnetoresistive strip 2 and transverse strips 3 (only one whereof is visible).

A concentrator 21 of soft ferromagnetic material (i.e., one that may be easily magnetized and does not maintain the magnetization after removal of the external magnetic field) extends in a trench 22 in the substrate 17. The concentrator 21 here has a U shape, the arms whereof extend parallel to axis Z and have a length much greater than its thickness. One of the arms of the concentrator 21 extends also in the insulating layer 17, as far as in the proximity or even in contact with the magnetoresistor 15. In an embodiment where the concentrator is in direct electrical contact with the magnetoresistor, to prevent the current flowing in the magnetoresistor from getting lost in the concentrator, the latter is discontinuous.

Consequently, when the magnetoresistive sensor 15 is subject to an external magnetic field Hz directed along axis Z, the arm of the concentrator 21 in contact with the magnetoresistor 18 causes a concentration and deflection of the field lines in horizontal direction (in plane XY) and generation of a horizontal field component Hy directed in the sensing direction. A reading circuit may then detect resistance variations of the magnetoresistor 15 in a known way.

This solution, although enabling detection of magnetic fields perpendicular to the chip with an arrangement of the magnetoresistor parallel to the fixing frame, may undergo improvement.

In fact, to form the concentrator 21 in the substrate 16, it is manufactured prior to forming the magnetoresistor 18 by forming the trench 22 and coating the walls thereof with a thin layer of ferromagnetic material. The step of depositing the ferromagnetic layer is not, however, simple because of the high aspect ratios. Further, in order to form the further structures of the device, the trench is filled with oxide. However, in some cases, the filling operations may entail limitations in treatment temperatures when forming structures after the concentrator, so as to prevent a reduction of the magnetic properties of the concentrator 21.

BRIEF SUMMARY

According to one embodiment of the present disclosure, an AMR-type integrated magnetoresistive sensor sensitive to perpendicular magnetic fields includes a semiconductor body, an insulating region, a set/reset coil, a first magnetoresistor, and a concentrator. The semiconductor body has a face extending in a plane, the insulating region is on the face of the body, and the set/reset coil is arranged within the insulating region. The first magnetoresistor is arranged within the insulating region and on the set/reset coil and includes an elongated first magnetoresistive strip extending longitudinally in a first direction. The concentrator is of ferromagnetic material, is arranged on the insulating region, and is formed by a plurality of distinct ferromagnetic regions aligned with each other parallel to the first direction.

In one embodiment, the concentrator is formed as the last element of the chip or die, immediately prior to passivation. Further, the set/reset coil, intended for "refresh" operations to maintain the magnetization set on the magnetoresistor in absence of external fields, is formed as the first element, underneath the magnetoresistor, by reversing the stack in the magnetoresistors, which normally envisage forming the set/reset coil as last element. Consequently, a planarized oxide layer is formed on the turns of metal material defining the set/reset coil, the magnetoresistor with its magnetic strips is formed over the oxide layer, and the concentrator is formed on top of the magnetoresistor. With this arrangement, the concentrator is closer to the sensitive regions but the flux lines generated by the set/reset coil during the refresh step could be deviated by the concentrator in a not useful direction, thus reducing the efficiency of the set/reset operation. To prevent this, the concentrator is formed in a discontinuous or discrete way, via a plurality of "bars" or parallelepipedal regions aligned parallel to extension axis of the magnetoresistor. In this way, the magnetoresistor and the concentrator are very close to each other, a high concentration effect and a high sensitivity to magnetic fields in direction Z are obtained, and the set and reset procedures are not significantly affected.

According to another aspect of the disclosure, each magnetoresistor comprises two magnetoresistive strips parallel to each other, and the concentrator extends in a midplane therebetween.

According to yet another aspect of the disclosure, the two magnetoresistive strips are the same to each other, having the same dimensions (width, length, and thickness) and being of the same material, so that the midplane also forms a symmetry plane for the two magnetoresistive strips that enables rejection of field components perpendicular to the sensing direction.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 6:
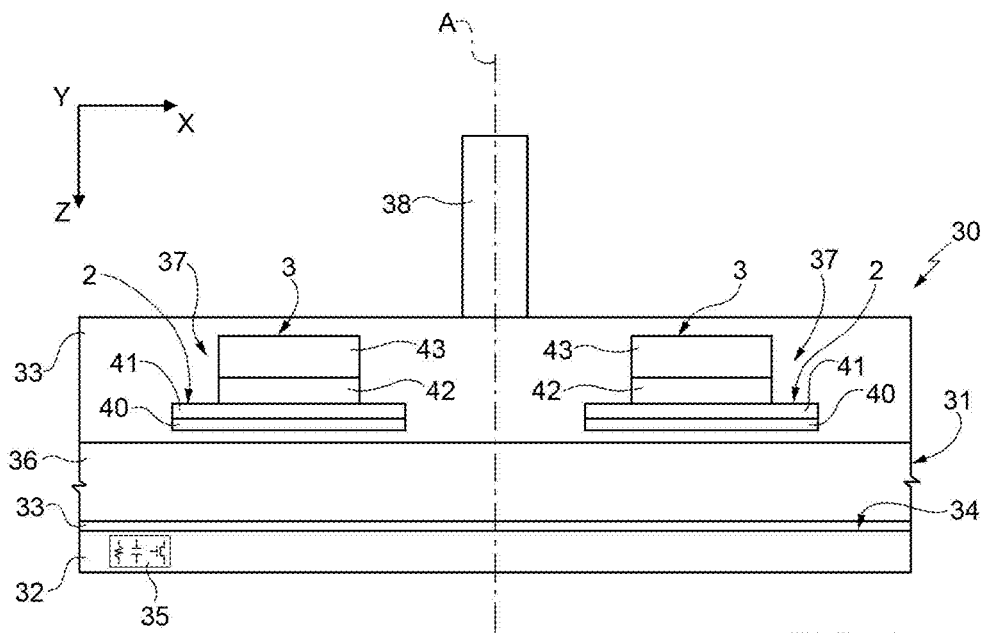
FIG. 6 is a cross-section of an embodiment of the present magnetoresistive sensor integrated in a semiconductor material chip.
Figure 7:
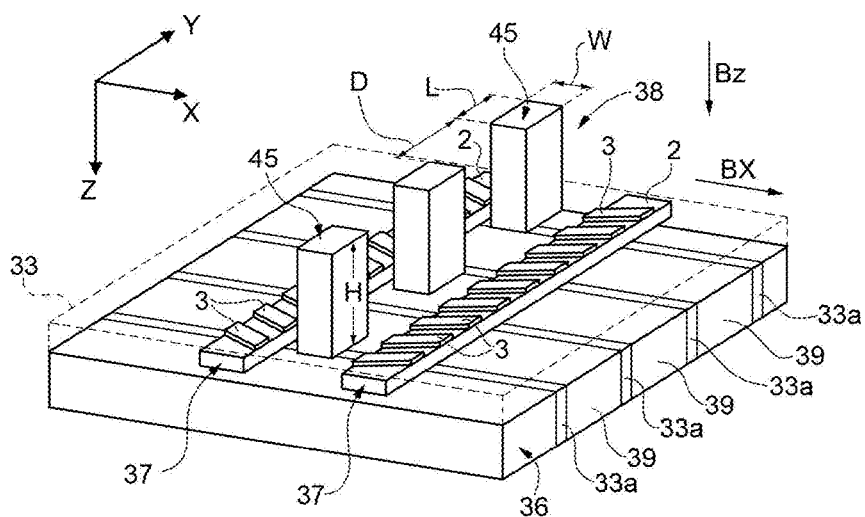
FIG. 7 is a simplified perspective top view of the magnetoresistive sensor of FIG. 6.

FIGS. 6 and 7 show a magnetoresistive sensor 30 integrated in a chip or die 31 of semiconductor material comprising a substrate 32 and an insulating region 33 overlying the substrate 32.

The substrate 32 has a main face 34, defining a plane XY of the magnetoresistive sensor 30. Electronic components, designated as a whole at 35, may be provided inside and/or above the substrate 32 for reading and processing the electrical signals generated by the magnetoresistive sensor 30, in a per se known manner.

The insulating region 33 is generally formed by a plurality of layers arranged on top of each other, as described hereinafter in detail, and houses a set/reset coil 36, at least one magnetoresistor 37 (two whereof are shown in FIGS. 6 and 7), and a concentrator 38, arranged on top of each other. In particular, these structures are stacked so that the set/reset coil 36 is the closest to the main face 34 and the concentrator 38 is the furthest away from the main face 34 (the very last component formed in the chip 31) and is arranged on top of the magnetoresistor 37. The magnetoresistor 37 is arranged between the level of the set/reset coil 36 and the level of the concentrator 38.

Figure 1A:
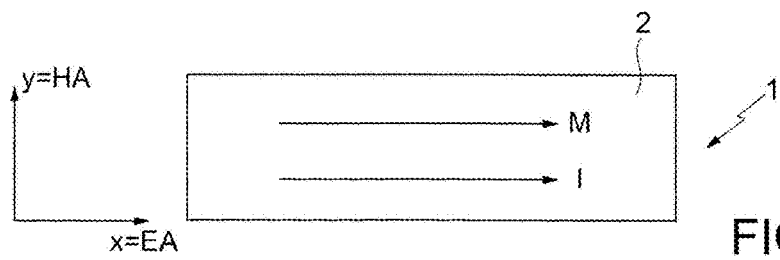
FIGS. 1A and 1B show schematically a known AMR-type magnetoresistor in absence and, respectively, presence of an external magnetic field.
Figure 1B:
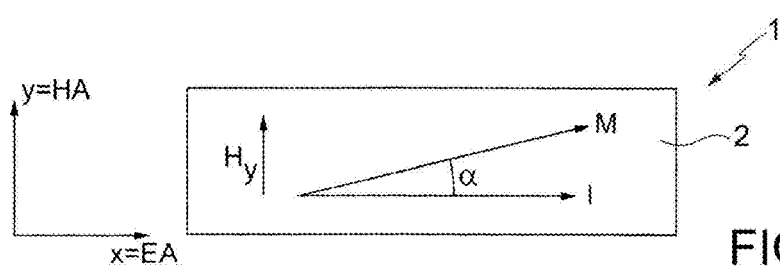
Figure 2:
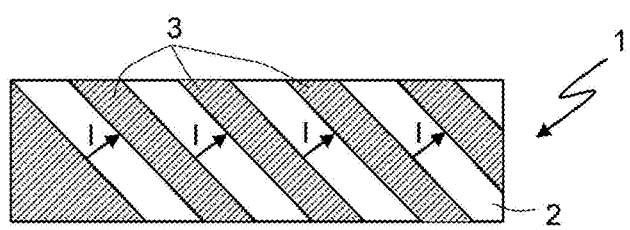
FIG. 2 shows schematically an embodiment of a known AMR magnetoresistor having barber poles.
Figure 3:
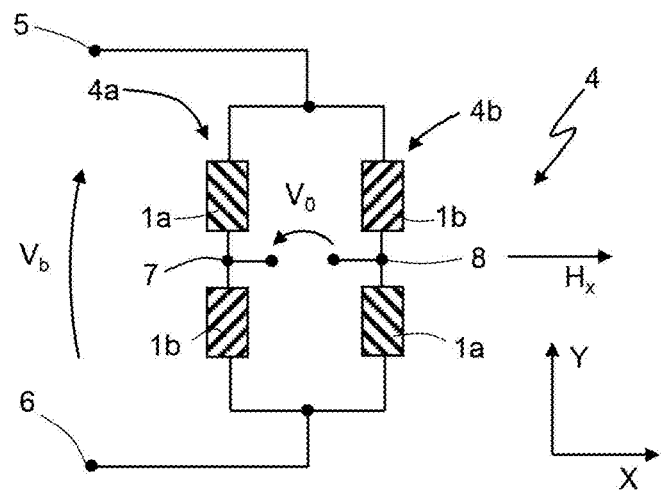
FIG. 3 shows a bridge-type magnetoresistive sensor formed by magnetoresistors of the type shown in FIG. 2.
Figure 4:
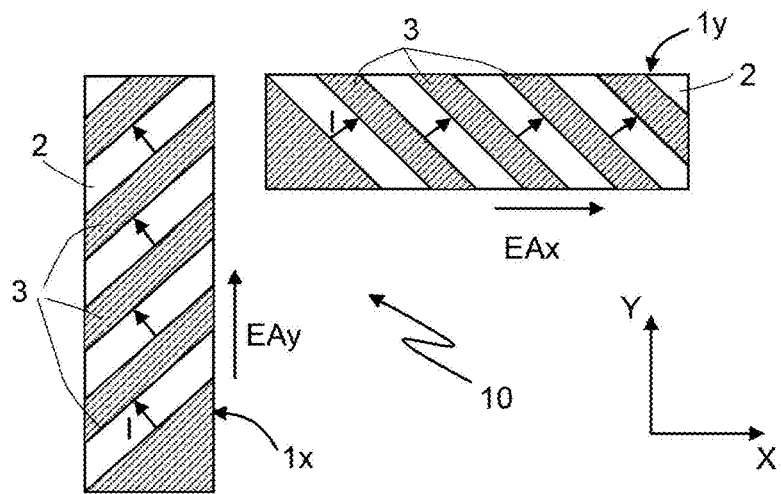
FIG. 4 is a top plan view of the layout of two magnetoresistors configured to detect magnetic fields directed parallel to the chip plane and perpendicular to each other.
Figure 5:
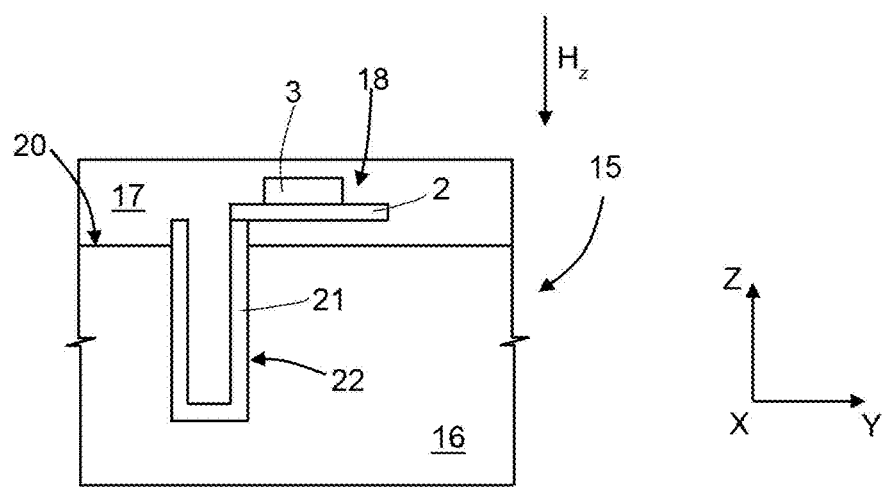
FIG. 5 is a cross-section of a known magnetoresistive sensor having a concentrator.

In the embodiment shown, the two magnetoresistors 37 extend parallel to each other. For example, the magnetoresistors may have a width of 2-10 µm, for example 6 µm, and be arranged at the distance of 2-18 µm, for example 6-7 µm. The two magnetoresistors 37 may be connected together in series (in a not shown way) for forming an elementary cell, as explained hereinafter. Alternatively, the two magnetoresistors 37 may be part of a Wheatstone bridge 4 as shown in FIG. 3 and form a branch 4a or 4b.

The set/reset coil 36, which has the aim of carrying out refresh operations, comprising repeated fast magnetization steps in the desired direction, is formed in a known way by a plurality of turns 39 of conductive material, such as aluminum or copper, whereof FIG. 7 shows the stretches that extend (in a transverse direction) underneath the magnetoresistors 37. The turns 39 are separated from each other by insulating portions 33a of the insulating region 33. In the area shown in FIG. 7, then, the stretches of the turns 39 and the portions 33a are parallel to axis X. For example, the turns 39 may have a width of 5-80 µm.

Each magnetoresistor 37 comprises a magnetoresistive strip 2 having an elongated shape in the direction of the easy axis (here axis Y) and barber poles 3. In particular, the magnetoresistive strip 2 is formed by the superposition of two layers, and precisely a magnetoresistive layer 40, such as permalloy (a ferromagnetic alloy containing iron and nickel), having a thickness of 10-70 µm, and a protective layer 41, for example of TaN and having a thickness of 20-150 µm. In turn, the barber poles 3 are formed by a first conductive layer 42, for example of TiW and having a thickness of 100 nm, and a second conductive layer 43, for example of Al and having a thickness of 0.2-1 µm.

The concentrator 38 is of ferromagnetic material, for example soft ferromagnetic material, in particular isotropic material, such as permalloy or other material with cobalt-iron base—such as cobalt-iron-silicon-boron (CoFeSiB) or cobalt-iron-silicon-molybdenum or cobalt-iron-silicon-niobium—such as to present a coercivity Hc close to zero (in order not to generate hysteresis/drift of the offset after exposure to intense magnetic fields) and a permeability as high as possible (in order to maximize the sensitivity in the direction of axis Z). Thereby, a greater concentrating effect is obtained, and it is possible to cause the sensitivity to be independent of the properties of the material and thus fixed just by the geometry of the concentrator.

The concentrator 38 is here formed by a plurality of portions or bars 45, which are distinct or separate from each other, have a parallelepipedal shape elongated in the direction Z, and are aligned to each other along a midplane between the magnetoresistors 37, designated at A in FIG. 6, so that the strips 2 of the magnetoresistors 37 are symmetrical with respect to the concentrator 38. In particular, each portion 45 has a width W in direction X (perpendicular to the magnetoresistors 37) smaller than the height H of the concentrator 38 (in a parallel direction to axis Z). For example, the ratio W/H may be less than 1:1, for example, 6:10 or 8:15 or even less, as allowed by the manufacturing technology. The length L of the bars 45 in direction Y and the space D between the bars 45 in the same direction (parallel to the magnetoresistors 37) is, instead, linked to the optimization of the set and reset procedure and thus depends on the design of the corresponding coil 36, in turn optimized so as to offer an optimal load towards the circuit for driving the reading circuit, typically an ASIC (Application Specific Integrated Circuit). Further the length L, generally greater than H and W, is chosen sufficiently large as to concentrate, on the magnetoresistive strips 2, a high field over a sufficiently extensive area. In this way, it is possible to ensure a significant variation of the resistance due to the magnetic field directed along axis Z. Also the needs for minimizing the area occupation may in part affect sizing of L.

In an exemplary embodiment, where the height H is determined by the thickness of the layer used for forming the concentrator 38 (as explained in detail hereinafter), H may be comprised between 5 µm and 30 µm, for example 10 µm, W may be comprised between 2 µm and 15 µm, for example 6 µm, and L may be greater than 10 µm, for example 20-100 µm. Further, the distance D between the bars 45 may be comprised between 5 µm and 16 µm.

In FIGS. 6 and 7, the magnetoresistors have barber poles 3 perpendicular to each other, at ±45° with respect to axis Y, and thus also these are symmetrical with respect to the midplane A.

With this arrangement and with the magnetoresistors 37 connected in series, the sensor 30 is able to detect magnetic field components parallel to axis Z and to cancel out the effect of possible magnetic field components coplanar to the face 34 (and thus parallel to axis X).

In fact, a magnetic-field component parallel to the positive axis Z (directed downwards) is guided in the magnetoresistors 37 in opposite directions, causing opposite rotations of the corresponding magnetizations and corresponding resistance variations according to the law:

$$R = R_{min} + R_d \cos^2 \alpha$$

where $R_{min}$ is the magnetoresistor resistance in case of magnetization M parallel to axis Y (easy axis), $R_d$ is the resistance difference $R_{max}-R_{min}$, where $R_{max}$ is the resistance in case of magnetization parallel to the direction X (hard axis), and a is the angle between axis Y and the current flowing in each magnetoresistor 37.

Due to the orthogonality of the directions of the barber poles 3, and the opposite magnetization variation undergone by the two magnetoresistors 37, the latter undergo an equal resistance variation.

Instead, a possible magnetic-field component parallel to axis X causes rotation of the magnetizations of the two magnetoresistors in the same direction and, because of the orthogonality of the barber poles 3, an opposite variation of the resistance R. An appropriate reading circuit is thus able to discriminate the two situations and generate a useful signal only in the case of equal resistance variation. For example, using the Wheatstone bridge 4 of FIG. 3, with barber poles 3 arranged as illustrated, a signal is outputted only in case of magnetic field directed in direction Z, whereas field components directed in direction X cause a zero output voltage $V_0$, if the two magnetoresistors 37 form a same resistance 1a or 1b or form resistances 1a or 1b of the same type.

Figure 8:
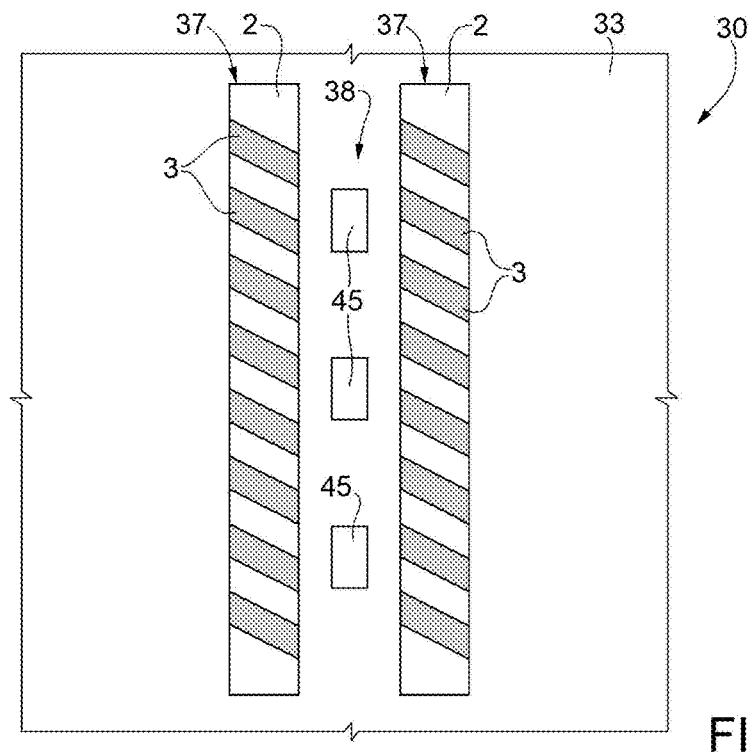
FIGS. 8-10 are top plan views of different embodiments of the present magnetoresistive sensor.

Alternatively, as shown in FIG. 8, the magnetoresistors 37 of the sensor 30 may have barber poles 3 parallel to each other. In this case, a magnetic field directed according to axis Z causes opposite resistance variations in the magnetoresistors 37. Instead, a magnetic field directed according to axis X causes equal variations.

This solution may be used with a reading circuit requiring opposite resistance variations for generating a useful output signal, for example in the Wheatstone bridge 4 of FIG. 3, with the magnetoresistors 37 forming the two components 1a or the two components 1b.

In the sensor 30 of FIGS. 6 to 8, simulations conducted by the present applicant have shown that the concentration effect of Z-field components and rejection of planar field components (in direction X) is the better, the better the alignment of the concentrator 38 with respect to the midplane (plane of symmetry) A. In fact, the magnetoresistors 37 have an exactly opposite behavior in presence of field components directed in the direction X in case of symmetrical position of the concentrator 38, and thus in this case it is possible to directly cancel out these effects.

Arrangement of the concentrator 38 on top of the magnetoresistors 37 as last component of the stack underneath the final passivation enables the concentrator to be arranged at a small distance from the magnetoresistors 37. For example, the distance between the concentrator 38 and the surface of the protective layer 41 of the magnetoresistive strips 2 may be approximately 1 µm, or even less. Further, the manufacturing steps prior to manufacturing the concentrator 38, in particular the thermal annealing treatments, may be studied in an optimal way, without affecting or jeopardizing the magnetic characteristics of the concentrator 38.

Further, the arrangement of the concentrator 38 on top of the magnetoresistors 37 enables a directed alignment between them, enabling a good reading of Z-field components and an optimal rejection of parallel field components.

Since the concentrator 38 is arranged in a remote position from the set/reset coil 36 and is provided in a non-continuous way, a reduction of the effects of the concentrator 38 on the field generated during the set/reset step by the coil 36 is obtained.

Figure 9:
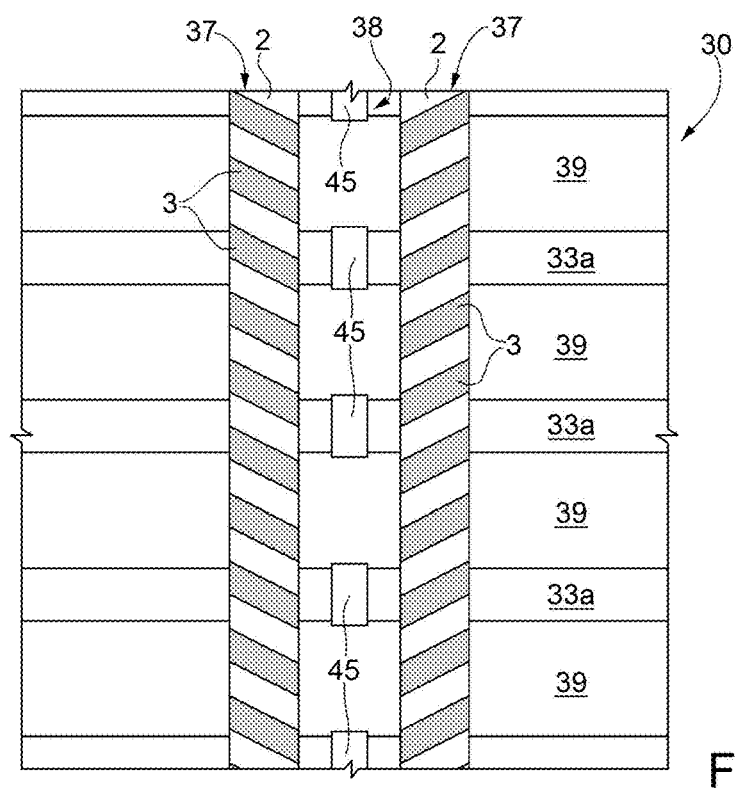

In order to reduce further the effects of the concentrator 38 on the set/reset coil 36, it is further possible to arrange the bars 45 in the spaces between the turns 39 filled by the insulating portions 33a of the insulating region 33 or in any case arrange the bars 45 centered with respect to the insulating portions 33a, as shown in FIG. 9. In practice, the bars 45 are arranged in direction Y with the same pitch as the turns 39 (for example, in the case of turns having a width of 30 µm and arranged at a distance of 4 µm, the have a pitch of 34 µm). In this way, the noise caused by the concentrator 38 on the set/reset field generated by the coil 36 is substantially reduced, and simulations made by the present applicant on the field generated on the magnetoresistors 37 after a set (or reset) current pulse have shown that, with the arrangement described, it is possible to obtain an average field much higher as compared to the situation of a concentrator 38 formed by a single continuous region.

Figure 10:
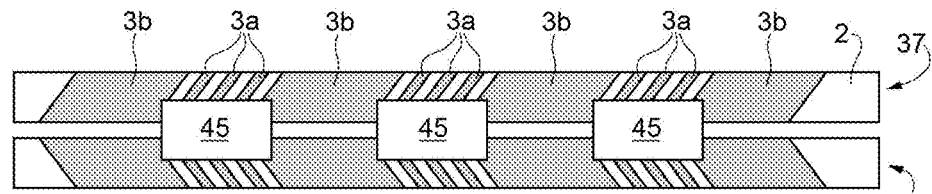

In a different embodiment, in order to increase the sensitivity and reduce the cross-axis interference, the barber poles 3 may have a greater width at the spaces between the bars 45, as shown in FIG. 10. Here, alongside the bars 45, the transverse strips (designated by 3a) have a standard width. Instead, alongside each space between the bars 45, just one wider strip (designated at 3b) is present for each magnetoresistor 37.

Figure 11:
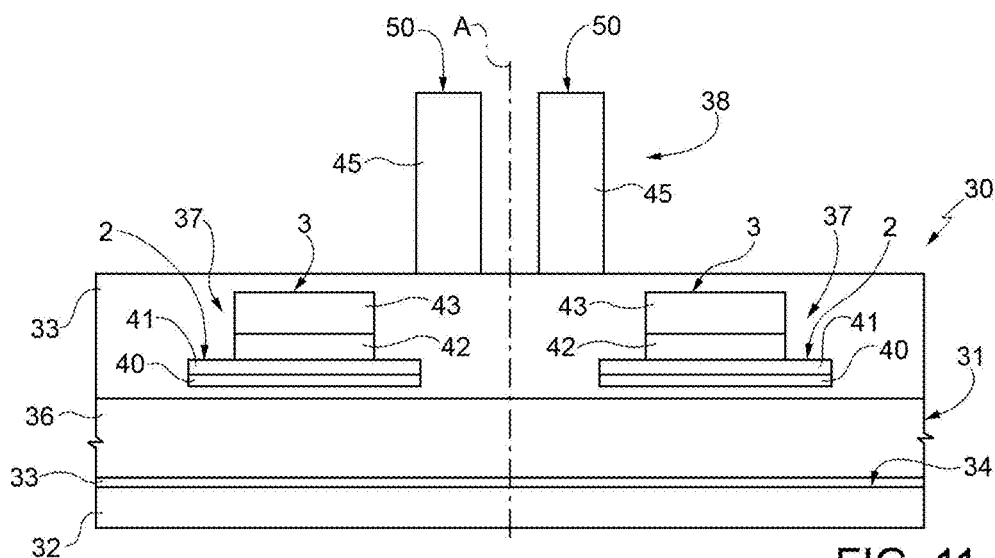
FIGS. 11 and 12 are, respectively, a cross-section and a top plan view of another embodiment of the present magnetoresistive sensor.
Figure 12:
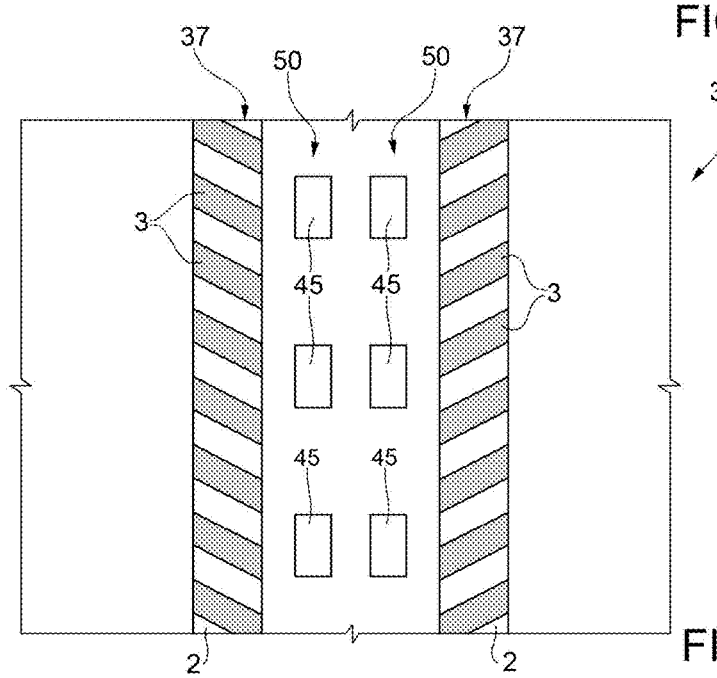

According to another embodiment, the concentrator 38 comprises two rows 50 of bars 45. The two rows 50 are arranged alongside each other, symmetrical to each other and to the midplane A, and between the magnetoresistors 37, as shown in FIGS. 11 and 12. The two rows 50 are arranged very close to each other. For example, the distance between the rows 50 may be of 5 µm.

The presence of two rows 50 enables increase of sensitivity of the magnetoresistive sensor 30 for a slight increase in area, since the magnetic field fluxes concentrated thereby add up, without increasing the demagnetization factor of the bars 45, as it would be obtained by forming the bars 45 with a large width W.

Figure 13:
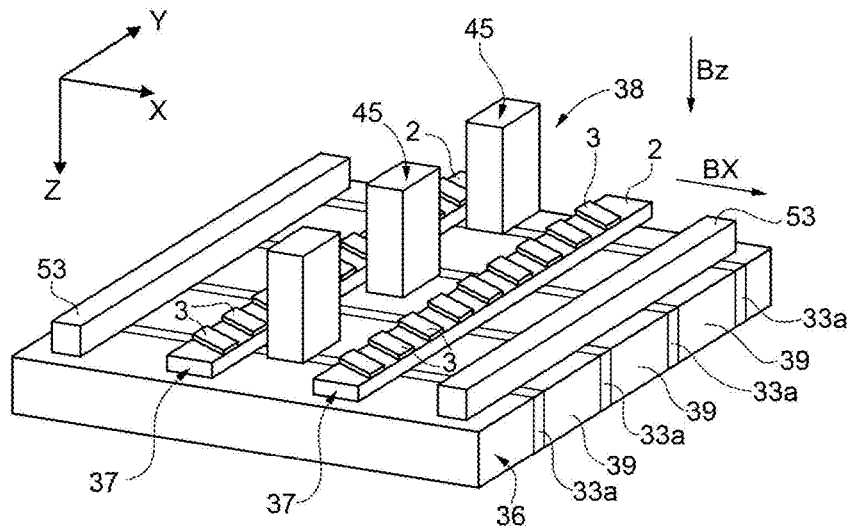
FIG. 13 is a perspective top view of a different embodiment of the present magnetoresistive sensor.
Figure 14:
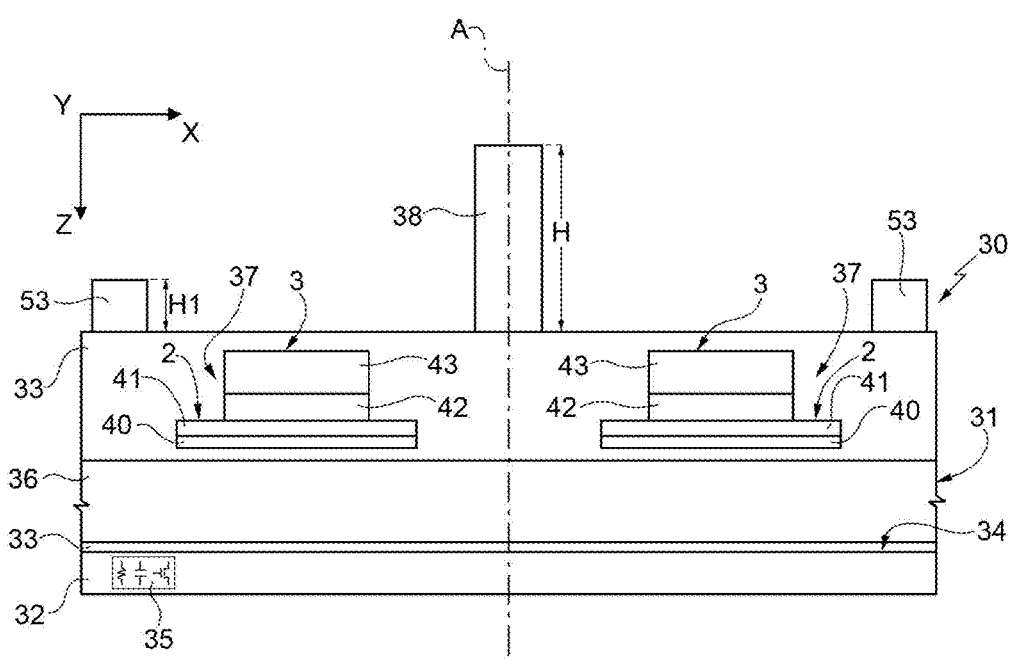
FIG. 14 is a cross-section of the magnetoresistive sensor of FIG. 13.

In a different embodiment, shown in FIGS. 13 and 14, two shielding regions 53, of ferromagnetic material, for example the same material as the concentrator 38, are formed at the sides of the concentrator 38, outside the magnetoresistors 37. In detail, the shielding regions 53 are of a substantially elongated parallelepipedal shape, extending parallel to the magnetoresistors 37, and thus to axis Y, above the insulating region 33, at the same level of the concentrator 38. The shielding regions 53 have a height H1 smaller than the height H of the concentrator 38.

The shielding regions 53 enable a wider sensitivity full scale to be obtained, for a small increase of the set/reset current. A large full scale is useful in the case of use of the magnetic sensor 30 as a compass, since the low value, Earth's magnetic field is added to magnetic fields of a higher value, for example magnetic fields generated by the mounting board of the compass (for example, cellphone, laptop, tablet board) due to the presence of speakers, supply lines and the like, or interfering environmental magnetic fields, which are in general variable. Such interfering fields, in the direction of the easy axis, here axis Y, may give rise to undesirable reset phenomena, which, shifting the magnetization value of the bars 45 in absence of field, could considerably reduce the sensitivity.

In order to prevent the above reset phenomena from reducing the sensitivity scale of the sensor, without on the other hand interfering excessively with the set/reset function, the non-linear behavior of ferromagnetic materials is exploited, which saturate at a value of saturation field Hk depending upon the material and the geometrical characteristics, in particular upon the layer thickness (here the height H1 of the shielding regions 53). In particular, the height H1 may be chosen in such a way that, during operation of the magnetoresistive sensor 30, the shielding regions 53 work in the linear area of the characteristic and thus considerably attenuate high interfering magnetic fields, directed in direction Y, preventing reset effects, and instead are in the saturation area for the higher values of magnetic field, used in the set/reset step. For example, by choosing H=10 μm and H1=4 μm, it is possible to set a saturation limit on the shielding regions 53 at a value of 16, 24, or 30 gauss, greater than the value of the expected interfering fields, but smaller than the field generated during set/reset step, generally, of at least 50 gauss.

The magnetoresistive sensor 30 may be formed in the way described in FIGS. 15A-15F, which regards manufacturing of the magnetoresistive sensor 30 of FIGS. 13 and 14, but may be readily adapted to form the embodiments shown in FIGS. 6-12.

In detail, initially (FIG. 15A), at the end of the manufacturing steps within the substrate 32 and after deposition of a first insulating layer 60, for example of silicon oxide, a thick metal layer 61, for example of aluminum, is deposited and defined via photolithographic techniques, for forming the set/reset coil 36. Then a second insulating layer 62, also for example of silicon oxide, is deposited and is planarized via CMP (chemical mechanical polishing). The second insulating layer 62 forms, i.a., the insulating portions 33a of the insulating region 33.

Then (FIG. 15B), the magnetoresistive layer 40, for example of permalloy or some other ferromagnetic NiFe alloy, is deposited and, thereon, the protective layer 41, for example of TaN, is deposited for protecting the magnetoresistive layer 40 during the subsequent manufacturing steps. Then, the layers 40, 41 are defined, for forming the magnetoresistive strips 2.

Next (FIG. 15C), the second insulating layer 62 is photolithographically defined for opening vias 63 as far as the metal layer 61. Then the first conductive layer 42, for example of TiW, and the second conductive layer 43, for example of Al, are deposited and photolithographically defined for forming the barber poles 3 and contact pads 65 in the vias 63.

Next (FIG. 15D), a third insulating layer 66, for example of silicon oxide, is deposited and planarized via CMP, thus forming, together with the first and second insulating layers 60, 62, the insulating region 33. The insulating region 33 thus has a planar surface parallel to the face 34. A seed layer 67, for example with a thickness of 100-200 nm, is deposited on the insulating region 33. For the embodiment of FIGS. 13 and 14, the shielding regions 53 are then formed on the seed layer 67 by defining the corresponding area and by electrolytic deposition growth, in a per se known manner.

Then (FIG. 15E), the concentrator 38 is formed by defining the corresponding area and selective, electrolytic deposition growth, in a way in per se known manner. In particular, in this step, there is growth of the plurality of bars 45 shown, for example, in FIG. 7.

Figure 15A:
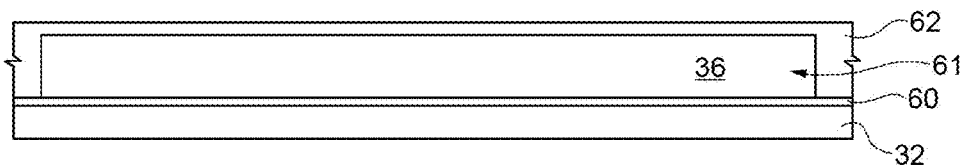
FIGS. 15A-15F are cross-sections of successive manufacturing steps of the magnetoresistive sensor of FIGS. 13 and 14.
Figure 15B:
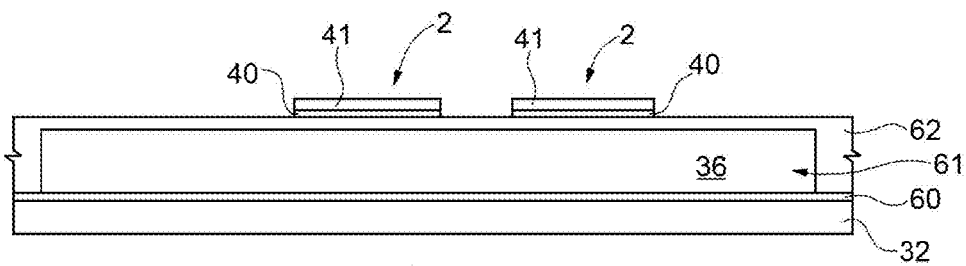
Figure 15C:
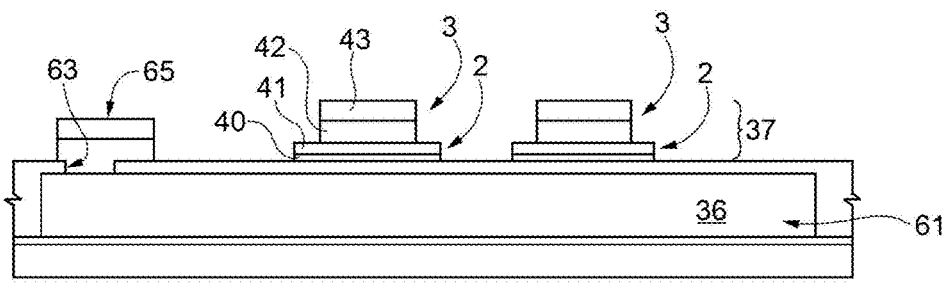
Figure 15D:
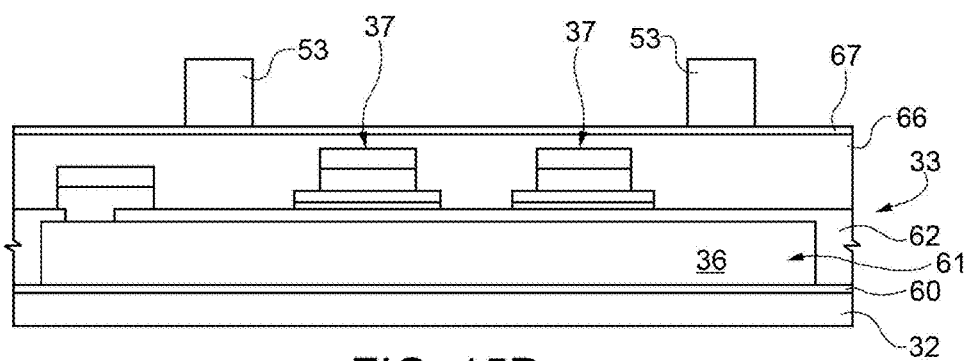
Figure 15E:
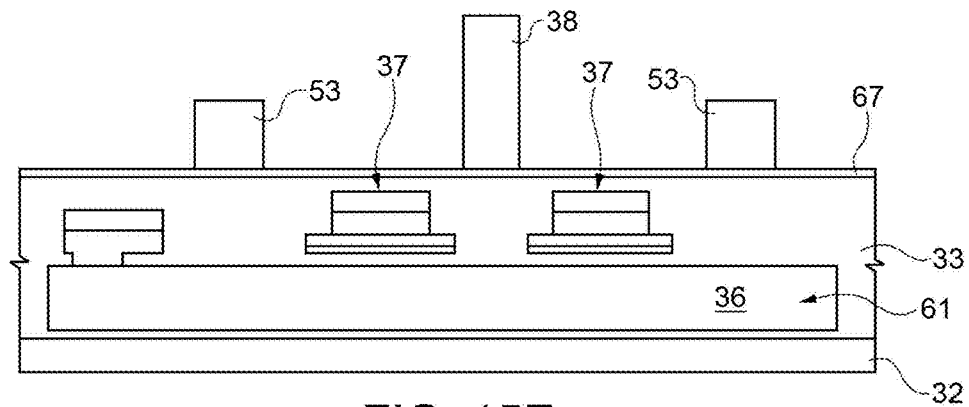
Figure 15F:
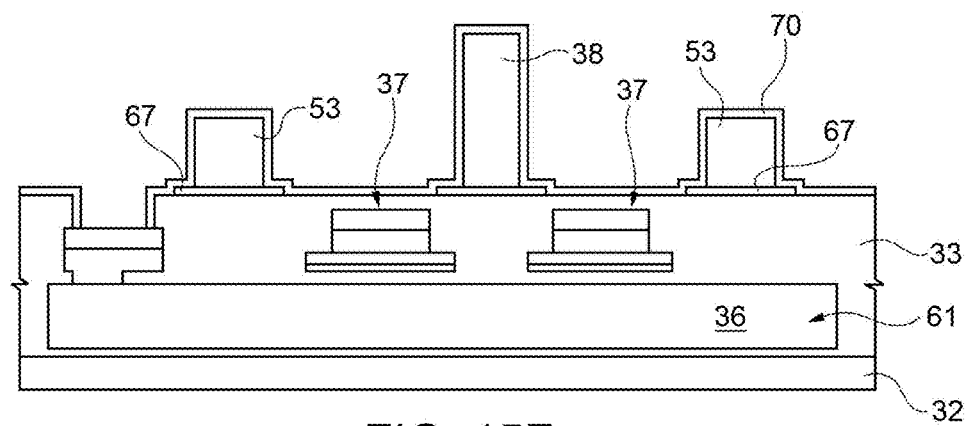

Finally, FIG. 15F, the seed layer 67 is etched and selectively removed from the surface of the insulating region 33, a passivation layer 70, for example of silicon oxide or nitride, is formed, and the passivation and insulating layers are removed at the contact pads 65.

Figure 16:
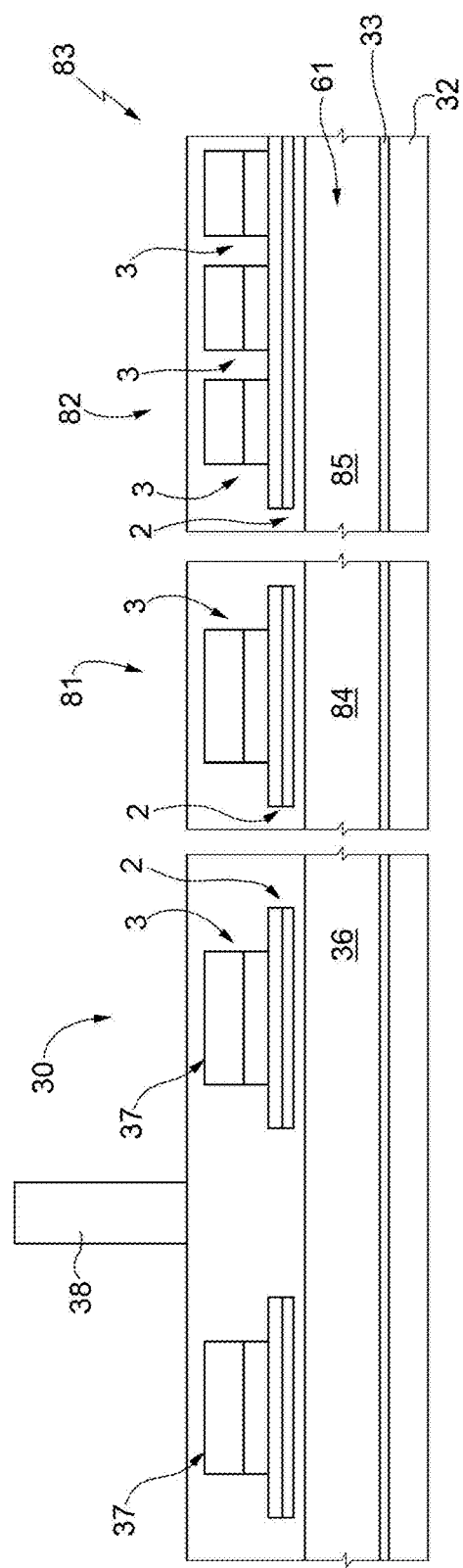
FIG. 16 is a cross-section of an embodiment of a magnetometer including the present integrated magnetoresistive sensor and magnetoresistive sensors for detecting magnetic fields parallel to the chip plane.

In this way, the temperatures and techniques for forming the metal layer 61 and of the insulating region 33 of silicon oxide do not adversely affect the magnetic properties of the ferromagnetic material of the concentrator 38. The magnetoresistive sensor 30 sensitive to magnetic fields directed perpendicular to the chip may be formed in a single chip with sensors sensitive to magnetic fields directed along axes X and Y, i.e., planar with respect to the chip. In particular, FIG. 16 shows a chip 80 integrating the magnetoresistive sensor 30 of FIG. 6, sensitive to magnetic fields parallel to axis Z, a first planar sensor 81, sensitive to magnetic fields parallel to axis X, and a second planar sensor 82, sensitive to magnetic fields parallel to axis Y. The sensors 81 and 82 are formed with the same technology used for the magnetoresistive sensor 30 and thus have respective set/reset coils 84, 85, formed in the metal layer 61, magnetoresistive strips 2 formed by the layers 40 and 41, and barber poles 3 formed by the conductive layers 42 and 43. Alternatively, the set/reset coils may be in common, in a known manner for biaxial sensors.

All three sensors 30, 81, 82 may comprise a plurality of magnetoresistors 37, connected for forming three Wheatstone bridges, as shown in FIG. 3 and as described above.

In this way, it is possible to provide a triaxial sensor or magnetometer integrated in a single chip 80. The described sensor has a high sensitivity and high resolution in all three directions and may be manufactured so as to overcome the yield and cost difficulties existing in some situations in the manufacture of the Z sensor.

The manufacturing process is particularly simple and far from costly, as compared with the currently used processes.

The architecture is very reliable in so far as the concentrator does not undergo thermal treatments that could jeopardize functionality thereof, and its manufacture is highly repeatable. Any possible problems of misalignment are not critical for proper operation.

Using the solution having shielding regions 53, it is possible to extend the sensitivity full scale, with a reduced impact on the set/reset currents, and thus on the consumption of the sensor.

Finally, it is clear that modifications and variations may be made to the magnetoresistive sensor described and illustrated herein and to the corresponding manufacturing method, without thereby departing from the scope of the present disclosure.

For example, even though the Z-magnetoresistive sensor is shown in the drawings parallel to axis X, it may be parallel to axis Y, or have any angle with respect to axes X, Y of the plane. Further, in the case of more pairs of magnetoresistors 37, these may even not be parallel to each other, but be arranged in the most useful way, for example so as to take into account layout requirements in the chip.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An AMR-type integrated magnetoresistive sensor sensitive to perpendicular magnetic fields, comprising:
   a body of semiconductor material, having a face extending in a plane and defining a first and a second direction;
   an insulating region on the face of the body;
   a set/reset coil arranged within the insulating region;
   a first magnetoresistor arranged within the insulating region and on the set/reset coil and including an elongated first magnetoresistive strip extending longitudinally parallel to the first direction; and
a concentrator of ferromagnetic material, arranged on the insulating region and formed by a plurality of distinct ferromagnetic bars aligned with each other parallel to the first direction and spaced apart from each other, wherein the ferromagnetic bars have each a substantially parallelepiped shape with a height in a third direction perpendicular to the face and a width in the second direction, wherein the height is greater than the width.

2. The magnetoresistive sensor according to claim 1, wherein a ratio of the width to height is less than 1:1.

3. The magnetoresistive sensor according to claim 2, wherein the ratio is between 6:10 and 8:15.

4. The magnetoresistive sensor according to claim 1, wherein the set/reset coil comprises a plurality of turns having stretches directed transversely to the first direction and spaced apart from each other via portions of the insulating region, wherein the ferromagnetic bars are arranged approximately centered on the portions of the insulating region.

5. The magnetoresistive sensor according to claim 1, wherein the first magnetoresistor has barber poles overlaid to the magnetoresistive strip and directed transversely to the first and second directions, the barber poles having respective widths that are equal to each other.

6. The magnetoresistive sensor according to claim 1, wherein the first magnetoresistor has barber poles overlaid to the first magnetoresistive strip and directed transversely to the first and second directions, the barber poles having respective widths in the first direction, with barber poles of smaller width alongside the ferromagnetic bars of the concentrator and barber poles of greater width alongside spaces between the ferromagnetic bars.

7. The magnetoresistive sensor according to claim 1, comprising a second magnetoresistor arranged within the insulating region and on the set/reset coil, the second magnetoresistor including an elongated second magnetoresistive strip extending longitudinally parallel to the first direction and laterally spaced apart from the first magnetoresistive strip; the concentrator extending substantially along a midplane between the first and second magnetoresistors.

8. The magnetoresistive sensor according to claim 7, wherein the first and second magnetoresistors have barber poles overlaying the respective magnetoresistive strips and directed transversely to the first and second directions, parallel or perpendicular to each other.

9. The magnetoresistive sensor according to claim 8, wherein the concentrator comprises two distinct rows of ferromagnetic bars, the two rows being arranged alongside each other and each being arranged on an opposite side of the midplane, symmetrically with respect to each other, between the first and second magnetoresistors.

10. The magnetoresistive sensor according to claim 7, comprising shielding regions of ferromagnetic material arranged on the insulating region and extending parallel to the first direction outside the magnetoresistive regions, the shielding regions having a smaller height than the concentrator.

11. The magnetoresistive sensor according to claim 1, comprising a plurality of magnetoresistors connected to form a Wheatstone bridge, each magnetoresistor including a magnetoresistive strip, the plurality of magnetoresistors including the first magnetoresistor.

12. An AMR-type triaxial magnetometer, comprising:
a body of semiconductor material, having a face extending in a plane and defining a first and a second direction;
an insulating region on the face of the body;
an integrated first magnetoresistive sensor sensitive to perpendicular magnetic fields, the first magnetoresistive sensor including:
a set/reset coil arranged within the insulating region;
a first magnetoresistor arranged within the insulating region and on the set/reset coil and including an elongated first magnetoresistive strip extending longitudinally parallel to the first direction; and
a concentrator of ferromagnetic material, arranged on the insulating region and formed by a plurality of distinct ferromagnetic bars aligned with each other parallel to the first direction and spaced apart from each other;
a planar second magnetoresistive sensor having sensitivity according to a first axis parallel to the plane; and
a planar third magnetoresistive sensor having sensitivity according to a second axis perpendicular to the first axis, wherein the ferromagnetic bars have each a substantially parallelepiped shape with a height in a third direction perpendicular to the face and a width in the second direction, wherein the height is greater than the width.

13. The triaxial magnetometer according to claim 12, wherein the set/reset coil comprises a plurality of turns having stretches directed transversely to the first direction and spaced apart from each other via portions of the insulating region, wherein the ferromagnetic bars are arranged approximately centered on the portions of the insulating region.

14. The triaxial magnetometer according to claim 12, wherein the first magnetoresistor has barber poles overlaid to the first magnetoresistive strip and directed transversely to the first and second directions, the barber poles having respective widths in the first direction, with barber poles of smaller width alongside the ferromagnetic bars of the concentrator and barber poles of greater width alongside spaces between the ferromagnetic bars.

15. The triaxial magnetometer according to claim 12, wherein the first magnetoresistive sensor includes a second magnetoresistor arranged within the insulating region and on the set/reset coil, the second magnetoresistor including an elongated second magnetoresistive strip extending longitudinally parallel to the first direction and laterally spaced apart from the first magnetoresistive strip; the concentrator extending substantially along a midplane between the first and second magnetoresistors.

16. An AMR-type integrated magnetoresistive sensor sensitive to perpendicular magnetic fields, comprising:
an insulating body;
a set/reset coil arranged within the insulating body;
elongated first and second magnetoresistor strips arranged within the insulating body and above the set/reset coil, the first and second magnetoresistive strips extending longitudinally parallel to each other; and
a first plurality of distinct ferromagnetic concentrator bars spaced apart from each other and aligned with each other in a first direction parallel to the first and second magnetoresistor strips and arranged on the insulating region, the concentrator bars extending upwardly directly above a region of the insulating body between the first and second magnetoresistor strips, wherein the ferromagnetic concentrator bars have each a substantially parallelepiped shape with a height in a second direction, perpendicular to a face of the insulating body from which the ferromagnetic concentrator regions extend, and a width in a third direction perpendicular to the first direction, wherein the height is greater than the width.

17. The magnetoresistive sensor according to claim 16, wherein the set/reset coil comprises a plurality of turns having stretches directed transversely to the first direction and spaced apart from each other via portions of the insulating body, wherein the ferromagnetic concentrator bars are arranged approximately centered on the portions of the insulating body.

18. The magnetoresistive sensor according to claim 16, further comprising barber poles overlaid to the first magnetoresistive strip and extending transversely to the first direction, the barber poles having respective widths in the first direction, with barber poles of smaller width alongside the ferromagnetic concentrator bars and barber poles of greater width alongside spaces between the ferromagnetic concentrator bars.

19. The magnetoresistive sensor according to claim 18, further comprising a second plurality of distinct ferromagnetic concentrator bars aligned with each other in a second direction parallel to the first direction, the first and second pluralities of distinct ferromagnetic concentrator bars being arranged alongside each other and each being arranged on an opposite side of a midplane, symmetrically with respect to each other, between the first and second magnetoresistor strips.

20. An AMR-type integrated magnetoresistive sensor sensitive to perpendicular magnetic fields, comprising:
  a body of semiconductor material, having a face extending in a plane and defining a first and a second direction;
  an insulating region on the face of the body;
  a set/reset coil arranged within the insulating region;
  a first magnetoresistor arranged within the insulating region and on the set/reset coil and including an elongated first magnetoresistive strip extending longitudinally parallel to the first direction; and
  a concentrator of ferromagnetic material, arranged on the insulating region and formed by a plurality of distinct ferromagnetic bars aligned with each other parallel to the first direction and spaced apart from each other, wherein the set/reset coil comprises a plurality of turns having stretches directed transversely to the first direction and spaced apart from each other via portions of the insulating region, wherein the ferromagnetic bars are arranged approximately centered on the portions of the insulating region.

21. The magnetoresistive sensor according to claim 20, wherein the first magnetoresistor has barber poles overlaid to the magnetoresistive strip and directed transversely to the first and second directions, the barber poles having respective widths that are equal to each other.

22. The magnetoresistive sensor according to claim 20, comprising a second magnetoresistor arranged within the insulating region and on the set/reset coil, the second magnetoresistor including an elongated second magnetoresistive strip extending longitudinally parallel to the first direction and laterally spaced apart from the first magnetoresistive strip; the concentrator extending substantially along a midplane between the first and second magnetoresistors.

23. An AMR-type integrated magnetoresistive sensor sensitive to perpendicular magnetic fields, comprising:
  an insulating body;
  a set/reset coil arranged within the insulating body;
  elongated first and second magnetoresistor strips arranged within the insulating body and above the set/reset coil, the first and second magnetoresistive strips extending longitudinally parallel to each other; and
  a first plurality of distinct ferromagnetic concentrator bars spaced apart from each other and aligned with each other in a first direction parallel to the first and second magnetoresistor strips and arranged on the insulating region, the concentrator bars extending upwardly directly above a region of the insulating body between the first and second magnetoresistor strips, wherein the set/reset coil comprises a plurality of turns having stretches directed transversely to the first direction and spaced apart from each other via portions of the insulating body, wherein the ferromagnetic concentrator bars are arranged approximately centered on the portions of the insulating body.

24. The magnetoresistive sensor according to claim 23, further comprising barber poles overlaid to the first magnetoresistive strip and extending transversely to the first direction, the barber poles having respective widths in the first direction, with barber poles of smaller width alongside the ferromagnetic concentrator bars and barber poles of greater width alongside spaces between the ferromagnetic concentrator bars.

25. The magnetoresistive sensor according to claim 23, further comprising a second plurality of distinct ferromagnetic concentrator bars aligned with each other in a second direction parallel to the first direction, the first and second pluralities of distinct ferromagnetic concentrator bars being arranged alongside each other and each being arranged on an opposite side of a midplane, symmetrically with respect to each other, between the first and second magnetoresistor strips.

* * * * *